United States Patent

Borchert et al.

Patent Number: 6,148,017
Date of Patent: Nov. 14, 2000

[54] LASER DIODE/MODULATOR COMBINATION

[75] Inventors: Bernd Borchert, Moosburg; Bernhard Stegmüller, Augsburg; Philipp Steinmann, München, all of Germany

[73] Assignee: Infineon Technologies AG, Munich, Germany

[21] Appl. No.: 09/466,642

[22] Filed: Dec. 17, 1999

Related U.S. Application Data

[63] Continuation of application No. PCT/DE97/00925, May 7, 1997.

[30] Foreign Application Priority Data

Jun. 19, 1996 [DE] Germany .................. 196 24 514

[51] Int. Cl.[7] ................................. H01S 3/19; H01S 3/10
[52] U.S. Cl. ............................................................ 372/50
[58] Field of Search .............................. 372/50, 45, 46, 372/96, 26

[56] References Cited

U.S. PATENT DOCUMENTS

| | | | |
|---|---|---|---|
| 5,305,343 | 4/1994 | Allovon et al. | 372/50 |
| 5,568,311 | 10/1996 | Matsumoto | 359/344 |
| 6,026,107 | 2/2000 | Huang | 372/50 |
| 6,066,859 | 5/2000 | Stegmueller | 372/50 |

*Primary Examiner*—James W. Davie
*Attorney, Agent, or Firm*—Herbert L. Lerner; Laurence A. Greenberg; Werner H. Stemer

[57] ABSTRACT

A monolithically integrated combination of a laser diode and a modulator is provided, in which one region of a common active layer structure is used for the laser and an adjacent region of that layer structure is used for the modulator, and in which the layer structure is an MQW structure with asymmetric potential wells decoupled from one another. The material compositions in the potential wells each have the smallest energy bandgap on the n-type side and are matched to the layer structure in such a way that, when the potential difference is applied in the reverse bias direction, a blue shift of the absorption edge beyond the laser wavelength takes place.

11 Claims, 2 Drawing Sheets

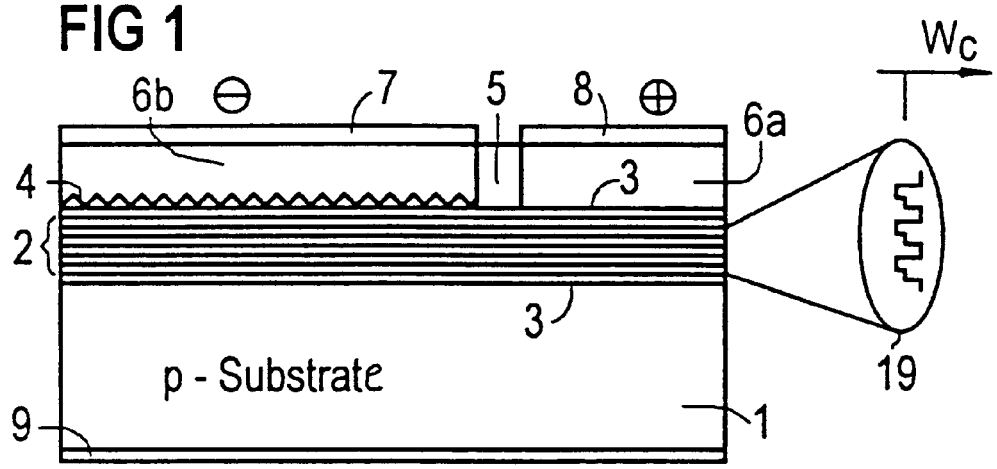
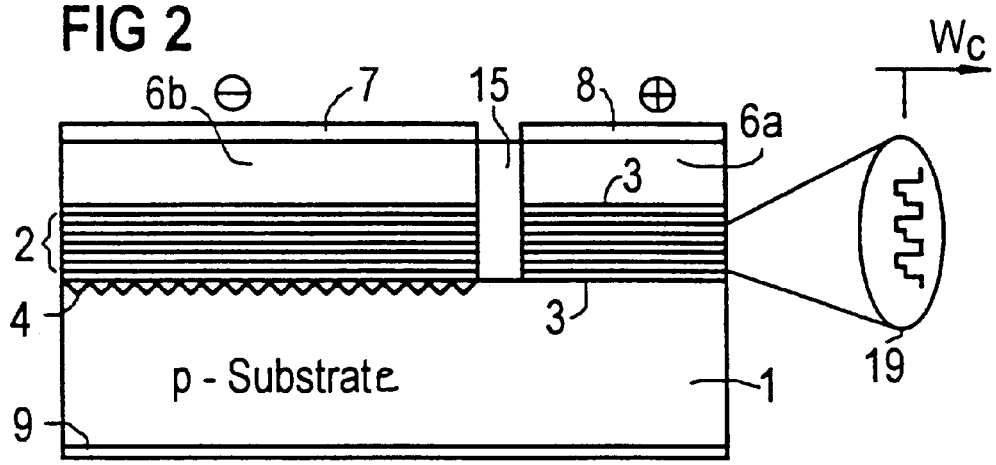
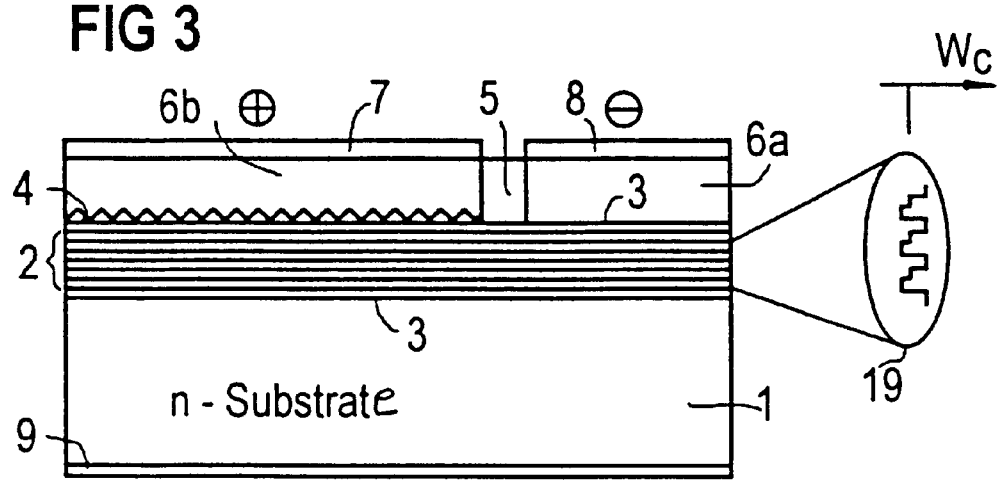

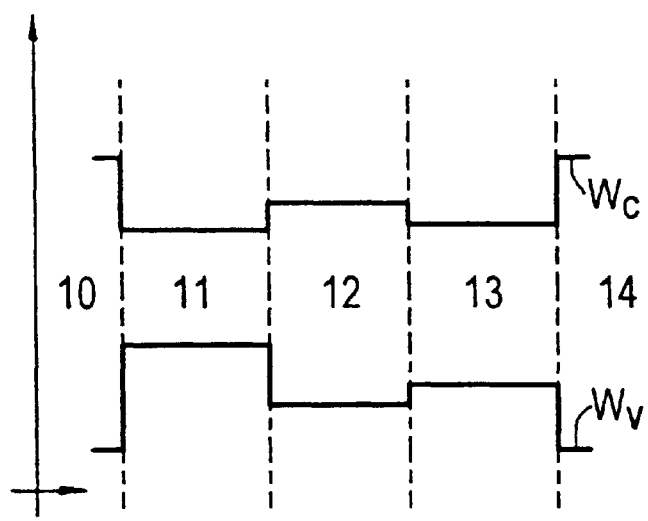
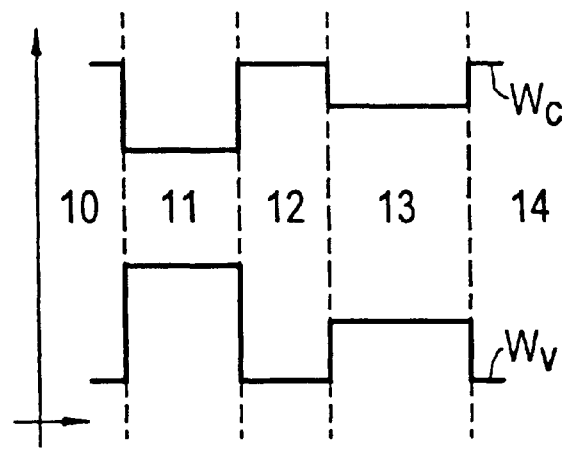
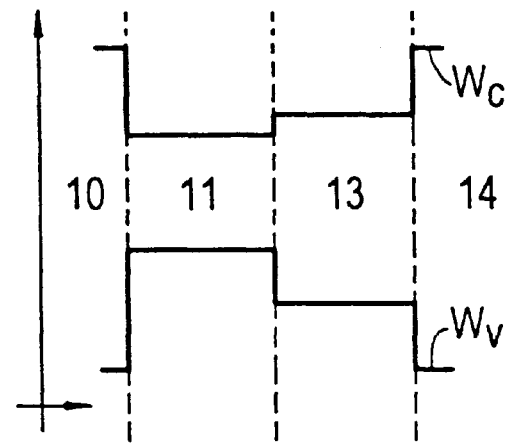

LASER DIODE/MODULATOR COMBINATION

CROSS-REFERENCE TO RELATED APPLICATION

This application is a continuation of copending International Application No. PCT/DE97/00925, filed May 7, 1997, which designated the United States.

BACKGROUND OF THE INVENTION

Field of the Invention

The present invention relates to the monolithic integration of a laser and a modulator.

High bit rates in information transmission can only be achieved optically. In a transmitting unit, a single-mode laser (e.g. a DFB laser) is used as a light source and an electro-absorption modulator is used as a switch. In order to achieve the requisite performance specifications both in the laser and in the modulator, both components utilize quantum effects which occur in QW (quantum well) structures in the active layer. In the modulator, the QCSE (Quantum Confined Stark Effect) is utilized. Monolithic integration of the laser diode and of the modulator is desirable in many ways: the losses when injecting the radiation into the modulator are minimized; higher bit rates and less chirp (broadening of the spectrum during modulation) are facilitated; and the costs for the transmitting unit as a whole are reduced. One problem in that regard is that the energy bandgap of the QW structure of the modulator must be greater than the energy bandgap of the laser, so that no absorption of the radiation takes place in the modulator. For that reason, either different material compositions or different spatial dimensions of the layer structures have to be used in the laser and in the modulator.

There are various approaches for obtaining the requisite difference in the energy bandgaps of the laser and of the modulator:

1. Two epitaxy steps are carried out, in which the QW structure of the laser is grown first, it is then etched away on the modulator side and the QW structure of the modulator is grown in a second epitaxy step.

2. Selective epitaxy takes place: During the epitaxy process masks are used to control the growth conditions in different regions of the growing surface. That makes it possible to grow QW structures with different layer thicknesses.

3. Part of the surface is post-treated by ion implantation. That leads to misalignments between the lattice atoms, which are remedied by heat treatment. The result is to increase the bandgap, and that post-treated part can be used as a modulator.

4. A shared layer structure may be used for the layers and the modulator. That layer structure may be constructed as an MQW (Multiple Quantum Well) structure or as a superlattice. In an MQW structure, the potential wells provided by the layer structure are decoupled from one another. In a structure with a superlattice, the potential wells are coupled so that, because of the resonant tunnel effect, energy-level splitting takes place in the potential wells. In an MQW structure, the emission wavelength of the laser is tuned to red using a DFB grating, as described in European Patent Application 0 627 798 A1. When a superlattice is used, the Wannier-Stark-Localization effect occurs under the influence of an electrical field, so that the energy bandgap becomes greater (blue shift of the absorption edge). That is utilized in the laser modulator of European Patent 0 531 214 B1, corresponding to U.S. Pat. No. 5,305,343.

SUMMARY OF THE INVENTION

It is accordingly an object of the invention to provide a monolithic integration of a laser diode and a modulator, which overcomes the hereinafcre-mentioned disadvantages of the heretofore-known devices of this general type and which is simple to produce.

With the foregoing and other objects in view there is provided, in accordance with the invention, a laser/modulator combination made of semiconductor material, comprising cladding layers, one of the cladding layers doped with n-type conductance and another of the cladding layers doped with p-type conductance; an active layer structure disposed between the cladding layers for producing radiation, the active layer structure including a plurality of sublayer structures; barrier layers separating the sublayer structures from one another, the barrier layers having a material composition with a greater energy bandgap than adjacent material compositions of the sublayer structures, causing each of the sublayer structures to form a potential well with respectively adjacent barrier layers, the barrier layers being at least thick enough for the potential wells to be decoupled from one another to form an MQW structure; each of the sublayer structures having a material composition varying continuously or in at least one step in a given direction perpendicular to a plane of the layers, causing the potential well being formed to be asymmetric in the given direction; in each of the sublayer structures, the semiconductor material having a material composition with lowest energy bandgap being closer to the cladding layer doped with n-type conduction than a remaining semiconductor material of the sublayer structure; the material compositions in each of the sublayer structures being matched to a three-dimensional structure of the sublayer structure, for permitting an increase in energy bandgaps of the sublayer structures in a given region of the active layer structure intended for modulation of radiation produced, by applying a potential difference in a reverse-bias direction defined by doping levels in the cladding layers to the given region; and at least three contacts each electrically conductively connected to one of the cladding layers and permitting one potential difference to be applied to a region of the active layer structure intended for radiation production, and another potential difference to be applied in the region of the active layer structure intended for modulation of the radiation produced.

In accordance with another feature of the invention, there is provided a DFB grating disposed in a projection of the region of the active layer structure intended for radiation production, the projection being perpendicular to the plane of the layers.

In accordance with a further feature of the invention, there is provided an isolating trench between the region of the active layer structure intended for radiation production and the region of the active layer structure intended for modulation of the radiation produced, the isolating trench forming a mirror end surface for creating a laser resonator in the region of the active layer structure intended for radiation production.

In accordance with an added feature of the invention, one of the cladding layers has two regions electrically insulated from one another, and two of the contacts are applied to one of the two regions of the one cladding layer.

In accordance with an additional feature of the invention, the active layer structure is made in a material system from the following groups: InGaAsP, AlGaAs, antimony compounds and II–VI compounds.

In accordance with yet another feature of the invention, each of the sublayer structures is composed of three sublayers including a middle sublayer and another two sublayers with material compositions, and the material composition of the middle sublayer has a greater energy bandgap than the material compositions of the other two sublayers.

In accordance with yet a further feature of the invention, the material composition of the barrier layers is at least approximately $In_{8.0}Ga_{0.2}As_{0.2}P_{0.8}$; the material composition of the middle sublayer is at least approximately $In_{0.72}Ga_{0.28}As_{0.63}P_{0.37}$; the material composition of the sublayer disposed between the middle sublayer and the cladding layer doped with n-type conductance is at least approximately $In_{0.67}Ga_{0.33}As_{0.93}P_{0.07}$; and the material composition of the sublayer disposed between the middle sublayer and the cladding layer doped with p-type conductance is at least approximately $In_{0.95}Ga_{0.05}As_{0.51}P_{0.49}$.

In accordance with yet an added feature of the invention, the material composition of the barrier layers is at least approximately $In_{0.66}Ga_{0.34}As_{0.63}P_{0.37}$; the material composition of the middle sublayer is at least approximately $In_{0.66}Ga_{0.34}As_{0.63}P_{0.37}$; the material composition of the sublayer disposed between the middle sublayer and the cladding layer doped with n-type conductance is at least approximately $In_{0.74}Ga_{0.26}As_{0.87}P_{0.13}$; and the material composition of the sublayer disposed between the middle sublayer and the cladding layer doped with p-type conductance is at least approximately $InAs_{0.53}P_{0.47}$.

In accordance with a concomitant feature of the invention, each of the sublayer structures is formed of two sublayers; the material composition of the barrier layers is at least approximately $In_{0.87}Ga_{0.13}A_{0.51}P_{0.49}$; the material composition of the sublayer disposed closer to the cladding layer doped with n-type conductance is at least approximately $In_{0.59}Ga_{0.41}As_{0.86}P_{0.14}$; and the material composition of the sublayer disposed closer to the cladding layer doped with p-type conductance is at least approximately $InAs_{0.53}P_{0.47}$.

In the laser/modulator according to the invention, a layer structure is provided having one section which forms the active layer of the laser diode and an adjacent section which is intended for the modulator. This layer structure forms an MQW structure with potential wells decoupled from one another. The individual potential wells are formed by asymmetric QW structures between barrier layers. These respective sublayer structures do not therefore have a symmetry plane parallel to the plane of the layers. Such asymmetric QW structures can exhibit a reverse QCSE. The application of an electric field can lead to a shift of the absorption edge into the blue, that is to say the energy bandgap becomes greater. This effect is the opposite of that occurring in conventional MQW structures, which shifts the absorption edge into the red. The asymmetric sublayer structures may be formed by various layers of different material composition or by grading of the material composition. If such an MQW structure with potential wells decoupled from one another is used as a shared layer structure both for the laser and for the modulator, the modulator absorbs without an applied field at precisely the wavelength at which the laser emits radiation. The emission wavelength of the laser lies behind the absorption edge in the shorter wavelength direction. Using the same MQW structure for the waveguide shared by the laser and the modulator thus has the effect of ensuring that no light emerges in this direction without an electric field being applied to the modulator. When a field is applied to the modulator by applying an electric voltage to the modulator in the reverse bias direction relative to the direction of the laser current, the absorption edge is shifted to shorter wavelengths past the emission wavelength of the laser. In the modulator, the wavelength emitted by the laser is therefore no longer absorbed. It is then possible for the radiation to emerge on the modulator side.

Other features which are considered as characteristic for the invention are set forth in the appended claims.

Although the invention is illustrated and described herein as embodied in a laser diode/modulator combination, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1 to 3 are diagrammatic, cross-sectional views of three different embodiments of the configuration according to the invention; and FIGS. 4 to 6 are graphical illustrations of energy band schemes for various embodiments of MQW structures.

DESCRIPTION OF THE PREFERRED EMBODIMENTS

Referring now to the figures of the drawings in detail and first, particularly, to FIG. 1 thereof, there is seen an embodiment in which an active layer structure 2 is disposed on a substrate 1 that is doped with p-type conductance in this case. Confinement layers 3 are disposed above and below the active layer structure 2 for wave-guiding. A DFB (Distributed Feedback) grating 4 is disposed parallel to the active layer structure in a section intended for a laser diode for producing laser resonance and for mode selection. The active layer structure 2 is preferably undoped. The confinement layers 3 that are intended for wave-guiding are preferably likewise undoped but, nevertheless, may instead be doped for the conductivity type of respective adjacent semiconductor layers. These adjacent semiconductor layers will be referred to below and in the claims as cladding layers.

In the simplified embodiment shown in FIG. 1, a lower cladding layer is formed simply by the substrate 1. Separate layers, for example a buffer layer which improves the substrate surface and separate lower cladding layers, may be disposed between the lower confinement layer 3 and the substrate 1, as are otherwise customary. An upper cladding layer includes two separate parts 6a, 6b. An insulating region 5, which extends down at least as far as the upper confinement layer 3, is disposed between these parts 6a, 6b of the upper cladding layer. The upper cladding layer 6a, 6b is doped with n-type conductance in this case. Preferably, an upper layer part of this upper cladding layer is heavily doped in order to create low resistance between the semiconductor material and metal contacts to be applied thereto. In particular, a separate, heavily doped contact layer may additionally be grown.

A contact 7 is applied to that part of the upper cladding layer 6b which is present above a region of the active layer structure 2 that is intended for radiation production. Correspondingly, there is a contact 8 on that part of the upper cladding layer 6a which is provided over a region of the active layer structure 2 that is intended for the modulator. A counterpart electrode for these contacts is formed by a further contact 9 which, in this example, is applied to the rear of the conductively doped substrate 1. If there is a separate lower cladding layer, the current may be delivered into the active layer structure through this cladding layer laterally and through a contact that is likewise provided at the top of the configuration. Instead of being disposed on the opposite side from the substrate, the DFB grating 4 may also be disposed on the same side of the active layer structure 2 as the substrate.

In order to create a laser resonator, an isolating trench may be provided between the laser region and the modulator region. A side of the trench forms a mirror end surface intended for a laser resonator. This isolating trench replaces the insulating region 5 at that location and extends at least down to the lower confinement layer disposed on the same side of the active layer structure as the substrate.

The active layer structure 2 is constructed as an MQW (Multiple Quantum Well) structure. This layer structure includes a plurality of sublayer structures, preferably 10 or more, which are separated from one another by barrier layers. These barrier layers are thick enough for the potential wells formed by the individual sublayer structures between the adjacent barrier layers to be decoupled from one another. The material compositions within each of these sublayer structures is chosen in such a way that there is no symmetry plane parallel to the plane of the layers within these sublayer structures, i.e. the potential wells are asymmetric. Within each sublayer structure, that semiconductor material having the material composition with the lowest energy bandgap is located closer to the cladding layer doped with n-type conductance than the remaining semiconductor material of the same sublayer structure. This is indicated in FIG. 1 by a diagram 19 shown at the side. A lower limit Wc of the conduction band is summarily represented there. An upper limit Wv of the valence band is to be regarded as approximately a mirror image thereof. As can be seen, the energy bandgap defined by the distance between these two lines is smaller above, i.e. at a larger distance from the substrate, than below, in each sublayer structure. In this diagrammatic representation, by way of example, a two-level sublayer structure with only two different material compositions is represented.

FIG. 2 shows a corresponding illustrative embodiment, in which the DFB grating 4 is disposed on the same side of the active layer structure 2 as the substrate 1. Instead of the continuous active layer structure 2, the regions for the laser diode and for the modulator are separated from one another by an isolating trench 15, so that the left-hand side of the isolating trench 15, as seen in the figure, forms a mirror end surface. This creates a resonator structure for the laser, so that it is also possible to do without the DFB grating 4. In the embodiments of FIGS. 1 and 2, the potential difference for driving the laser is applied according to the sign of the conductivity of the cladding layers. The negative pole of this potential difference is therefore applied to the contact 7, and the positive pole to contact 9. In the modulator region, a potential difference is applied in the opposite direction, i.e. in the reverse bias direction with regard to the signs of the conductivities of the cladding layers. The contact 8 therefore receives a potential which is positive relative to the potential applied to the contact 9. Driving the modulator in the reverse bias direction, with a suitably chosen value of the potential difference, permits such an electric field to be created in the sublayer structures of the MQW structure that the above-described reverse QCSE with a blue shift of the absorption edge takes place. In the embodiment of FIG. 2, in which no further structure is applied on the top of the upper confinement layer 3, this upper confinement layer 3 in particular can be used as the upper cladding layer. This confinement layer is then formed with n-type conductance, and the contacts 7, 8 are applied directly to the confinement layer or to a heavily doped contact layer applied thereon.

In the embodiment illustrated in FIG. 3, the signs of the doping are reversed in comparison with the embodiment illustrated in FIG. 1. The substrate 1 is doped with n-type conductance in this case. The upper cladding layer 6a, 6b is doped with p-type conductance. Accordingly, when the configuration is being driven, the most positive potential is to be applied to the contact 7 and the most negative potential to the contact 8. This illustrative embodiment represents the preferred embodiment of the invention. The DFB grating may also be disposed between the substrate 1 and the active layer structure 2 in this zase, and may optionally be omitted when an isolating trench is used.

FIGS. 4 to 6 serve to explain the material compositions in the sublayer structures forming the potential wells. These figures each represent diagrams in which the lower limit of the conduction band Wc and the upper limit of the valence band Wv are represented for a respective sublayer structure. The distance from one of the confinement layers is plotted on the abscissa. In the examples of FIGS. 4 and 5, each sublayer structure is formed by a middle sublayer 12 and two outer sublayers 11, 13, which are disposed between barrier layers 10, 14. The material compositions in this case are altered in steps.

In the example of FIG. 6, the sublayer structure is composed of only two sublayers 11, 13 between barrier layers 10, 14. In order to simplify the layer sequence, the barrier layers are preferably each made with the same material composition. The sublayer with the lowest energy bandgap (sublayer 11 in each of the examples) is always on the same side as the cladding layer which is doped with n-type conductance. In the InP material system, typical material compositions are, for example:

For the embodiment illustrated in FIG. 4: $In_{0.8}Ga_{0.2}As_{0.2}P_{0.8}$ in the barrier layers 10, 14, $In_{0.67}Ga_{0.33}As_{0.93}P_{0.07}$ in the sublayer 11 facing the side doped with n-type conductance, $In_{0.95}Ga_{0.05}As_{0.51}P_{0.49}$ in the sublayer 13 facing the side doped with p-type conductance and $In_{0.72}Ga_{0.28}As_{0.63}P_{0.37}$ in the middle sublayer 12.

For the embodiment of FIG. 5: $In_{0.66}Ga_{0.34}As_{0.63}P_{0.37}$ in the barrier layers 10, 14 and in the middle sublayer 12, $In_{0.74}Ga_{0.26}As_{0.87}P_{0.13}$ in the sublayer 11 facing the side doped with n-doped conductance and $InAs_{0.53}P_{0.47}$ in the sublayer 13 facing the side doped with p-type conductance.

For the embodiment of FIG. 6: $In_{0.87}Ga_{0.13}As_{0.51}P_{0.49}$ in the barrier layers 10, 14, $In_{0.59}Ga_{0.41}As_{0.86}P_{0.14}$ in the sublayer 11 facing the side doped with n-type conductance and $InAs_{0.53}P_{0.47}$ in the sublayer facing the side doped with p-type conductance.

In order to ensure the effect which is fundamental to the invention, that is a sufficiently large blue shift in the modulator region, the material compositions of the sublayer structures should be respectively tailored to the intended number of sublayers and the intended emission wavelength. This tailoring is carried out according to scientific knowledge about the occurrence of the reverse QCSE in asymmetric MQW structures as presented, for example, in a publication by W. Chen and T. G. Andersson: entitled "Quantum-Confined Stark Shift for Differently Shaped Quantum Wells" in Semicond. Sci. Technol. 7, 828–836 (1992), and is done, for example, computationally using model calculations. Various material systems can be used to implement the invention, for example InGaAsP, AlGaAs, antimonide compounds or II–VI compounds. The InGaAsP material system is preferred. The laser diode/modulator combination according to the invention can therefore be produced for a wide variety of wavelengths. Monolithic integration of the laser with the modulator by using a shared asymmetric MQW structure in the active layer therefore allows the integration to be carried out more simply and more cost-efficiently, and furthermore with better technical specifications than are known from the prior art.

As compared with the integrated laser diode/modulator combinations which are produced in tailored epitaxy steps or with subsequent ion implantation, the combination according to the invention can be produced substantially more simply and therefore with a greater yield of functioning components. As compared with such a combination with a tuned laser, i.e. an integrated laser diode which is driven outside its maximum gain, the combination according to the invention is distinguished by a more favorable compromise between the desired optimization of the modulator and the optimization of the laser, since the laser can be driven at maximum gain. Use of a superlattice instead of the MQW structure according to the invention results in considerably less favorable laser properties. The requisite large number of interfaces in a superlattice increases the internal losses, and the production of superlattice is overall more demanding in technical terms.

We claim:

1. In a laser/modulator combination made of semiconductor material, the improvement comprising:

cladding layers, one of said cladding layers doped with n-type conductance and another of said cladding layers doped with p-type conductance;

an active layer structure disposed between said cladding layers for producing radiation, said active layer structure including a plurality of sublayer structures;

barrier layers separating said sublayer structures from one another, said barrier layers having a material composition with a greater energy bandgap than adjacent material compositions of said sublayer structures, causing each of said sublayer structures to form a potential well with respectively adjacent barrier layers, said barrier layers being at least thick enough for said potential wells to be decoupled from one another to form an MQW structure;

each of said sublayer structures having a material composition varying in a given direction perpendicular to a plane of said layers, causing said potential well being formed to be asymmetric in said given direction;

in each of said sublayer structures, the semiconductor material having a material composition with lowest energy bandgap being closer to said cladding layer doped with n-type conduction than a remaining semiconductor material of said sublayer structure;

said material compositions in each of said sublayer structures being matched to a three-dimensional structure of said sublayer structure, for permitting an increase in energy bandgaps of said sublayer structures in a given region of said active layer structure intended for modulation of radiation produced, by applying a potential difference in a reverse-bias direction defined by doping levels in said cladding layers to said given region; and at least three contacts each electrically conductively connected to one of said cladding layers and permitting one potential difference to be applied to a region of said active layer structure intended for radiation production, and another potential difference to be applied in said region of said active layer structure intended for modulation of the radiation produced.

2. The laser/modulator combination according to claim 1, wherein said material composition of said sublayer structures varies continuously.

3. The laser/modulator combination according to claim 1, wherein said material composition of said sublayer structures varies in at least one step.

4. The laser/modulator combination according to claim 1, including a DFB grating disposed in a projection of said region of said active layer structure intended for radiation production, said projection being perpendicular to said plane of said layers.

5. The laser/modulator combination according to claim 1, including an isolating trench between said region of said active layer structure intended for radiation production and said region of said active layer structure intended for modulation of the radiation produced, said isolating trench forming a mirror end surface for creating a laser resonator in said region of said active layer structure intended for radiation production.

6. The laser/modulator combination according to claim 1, wherein one of said cladding layers has two regions electrically insulated from one another, and two of said contacts are applied to one of said two regions of said one cladding layer.

7. The laser/modulator combination according to claim 1, wherein said active layer structure is made in a material system from the following groups: InGaAsP, AlGaAs, antimony compounds and II–VI compounds.

8. The laser/modulator combination according to claim 1, wherein each of said sublayer structures is composed of three sublayers including a middle sublayer and another two sublayers with material compositions, and said material composition of said middle sublayer has a greater energy bandgap than said material compositions of said other two sublayers.

9. The laser/modulator combination according to claim 8, wherein:

said material composition of said barrier layers is at least approximately $In_{0.8}Ga_{0.2}As_{0.2}P_{0.8}$;

said material composition of said middle sublayer is at least approximately $In_{0.72}Ga_{0.28}As_{0.63}P_{0.37}$;

said material composition of said sublayer disposed between said middle sublayer and said cladding layer doped with n-type conductance is at least approximately $In_{0.67}Ga_{0.33}As_{0.93}P_{0.07}$; and said material composition of said sublayer disposed between said middle sublayer and said cladding layer doped with p-type conductance is at least approximately $In_{0.95}Ga_{0.05}As_{0.51}P_{0.49}$.

10. The laser/modulator combination according to claim 8, wherein:

said material composition of said barrier layers is at least approximately $In_{0.66}Ga_{0.34}As_{0.63}P_{0.37}$;

said material composition of said middle sublayer is at least approximately $In_{0.66}Ga_{0.34}As_{0.63}P_{0.37}$;

said material composition of said sublayer disposed between said middle sublayer and said cladding layer doped with n-type conductance is at least approximately $In_{0.74}Ga_{0.26}As_{0.87}P_{0.13}$; and said material composition of said sublayer disposed between said middle sublayer and said cladding layer doped with p-type conductance is at least approximately $InAs_{0.53}P_{0.47}$.

11. The laser/modulator combination according to claim 1, wherein:

each of said sublayer structures is formed of two sublayers;

said material composition of said barrier layers is at least approximately $In_{0.87}Ga_{0.13}As_{0.51}P_{0.49}$;

said material composition of said sublayer disposed closer to said cladding layer doped with n-type conductance is at least approximately $In_{0.59}Ga_{0.41}As_{0.86}P_{0.14}$; and said material composition of said sublayer disposed closer to said cladding layer doped with p-type conductance is at least approximately $InAs_{0.53}P_{0.47}$.

* * * * *